(12) United States Patent
Wang

(10) Patent No.: US 11,705,893 B2
(45) Date of Patent: Jul. 18, 2023

(54) LATCH CIRCUIT

(71) Applicant: CHANGXIN MEMORY TECHNOLOGIES, INC., Hefei (CN)

(72) Inventor: KeJun Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/608,401

(22) PCT Filed: Mar. 9, 2021

(86) PCT No.: PCT/CN2021/079622
§ 371 (c)(1),
(2) Date: Nov. 2, 2021

(87) PCT Pub. No.: WO2021/190290
PCT Pub. Date: Sep. 30, 2021

(65) Prior Publication Data
US 2023/0034171 A1    Feb. 2, 2023

(30) Foreign Application Priority Data

Mar. 23, 2020 (CN) .......................... 202010207998.8

(51) Int. Cl.
*H03K 3/037* (2006.01)
*G11C 17/16* (2006.01)
*G11C 17/18* (2006.01)
*H03K 19/20* (2006.01)

(52) U.S. Cl.
CPC ............. *H03K 3/037* (2013.01); *G11C 17/16* (2013.01); *G11C 17/18* (2013.01); *H03K 19/20* (2013.01)

(58) Field of Classification Search
CPC .......... H03K 3/037; G11C 7/10; G11C 7/106; G11C 7/1087; G11C 17/16; G11C 17/18; G11C 29/12; G11C 29/12015
See application file for complete search history.

(56) References Cited

U.S. PATENT DOCUMENTS

| 5,677,917 A | 10/1997 | Wheelus |
| 2001/0015654 A1 | 8/2001 | Habersetzer et al. |
| 2001/0052633 A1 | 12/2001 | Oikawa |

(Continued)

FOREIGN PATENT DOCUMENTS

| CN | 1379407 A | 11/2002 |
| CN | 1666297 A | 9/2005 |

(Continued)

OTHER PUBLICATIONS

International Search Report in Application No. PCT/CN2021/079622, dated Jun. 11, 2021.

(Continued)

*Primary Examiner* — Patrick O Neill
(74) *Attorney, Agent, or Firm* — Syncoda LLC; Feng Ma

(57) ABSTRACT

A latch circuit includes a latch module, a set control module, a reset control module and a clock module, wherein the latch module is employed for latching data input by a data module, the set control module is employed for controlling the latch module to output a high-level signal, the reset control module is employed for controlling the latch module to output a low-level signal, and the clock module is employed for providing a readout clock signal to the latch module.

10 Claims, 4 Drawing Sheets

(56) References Cited

U.S. PATENT DOCUMENTS

| | | | | |
|---|---|---|---|---|
| 2008/0303573 A1* | 12/2008 | Hsieh | ............ | H03K 3/0375 |
| | | | | 327/202 |
| 2013/0073918 A1 | 3/2013 | Chen | | |
| 2013/0328601 A1 | 12/2013 | Geisler et al. | | |
| 2020/0005883 A1 | 1/2020 | Agrawal et al. | | |
| 2023/0015237 A1* | 1/2023 | Gu | ............ | H03K 19/20 |

FOREIGN PATENT DOCUMENTS

| | | | |
|---|---|---|---|
| CN | 1697319 | A | 11/2005 |
| CN | 101404184 | A | 4/2009 |
| CN | 103345936 | A | 10/2013 |
| CN | 104796132 | A | 7/2015 |
| CN | 106257595 | A | 12/2016 |
| CN | 108564982 | A | 9/2018 |
| CN | 109979522 | A | 7/2019 |
| JP | 2016004594 | A | 1/2016 |

OTHER PUBLICATIONS

Written Opinion of the International Search Authority in the international application No. PCT/CN2021/079622, dated Jun. 11, 2021.
Kyunam Lim et al., "Bit Line Coupling Scheme and Electrical Fuse Circuit For Reliable Operation of High Density DRAM", <2001 Symposium on VLSI Circuits. Digest of Technical Papers>, p. 33-34, Aug. 7, 2002.
Notice of Allowance of the Chinese application No. 202010207998. 8, dated Apr. 26, 2022.

* cited by examiner

LATCH CIRCUIT

CROSS-REFERENCE TO RELATED APPLICATIONS

This application is a national stage of International Application No. PCT/CN2021/079622 filed on Mar. 9, 2021, which claims priority to Chinese Patent Application No. 202010207998.8 filed on Mar. 23, 2020. The disclosures of these applications are hereby incorporated by reference in their entirety.

TECHNICAL FIELD

The present application relates to the field of integrated circuits, and particularly to a latch circuit.

BACKGROUND

A large amount of fuse devices or antifuse devices is used in conventional DRAM chips, and a great quantity of latches is required for use in order to store the states of the fuse devices or antifuse devices. At the same time, latches are also used to store self-test signals for the purpose of testing.

However, thousands—even ten thousands—of latches are possibly used in a DRAM chip, and such overuse of latches occupies a great area of the naked chip, and leads to increase in area of the chip.

SUMMARY

According to one aspect of the present application, there is provided a latch circuit that comprises:
a latch module, for latching data input by a data module;
a set control module, for controlling the latch module to output a high-level signal, a input signals of the set control module including a control signal and a set signal;
a reset control module, for controlling the latch module to output a low-level signal, a input signals of the reset control module including an output signal of the set control module, a self-test enable signal and a reset signal; and
a clock module, for providing a readout clock signal to the latch module;
wherein the self-test enable signal decides whether a latch is in a self test mode or a normal operation mode.

In the technical solution of the present application, by settings of the latch module, the set control module, the reset control module and the clock module, by enabling the set control module to control the latch module to output the high-level signal in the self test mode, by enabling the latch to output the high-level signal for testing, and by enabling the latch module to read and latch data from the data module according to the readout clock signal in the normal operation mode, realized are the function to latch the data input by the data module, and the DFT function, and the structure of the latch circuit is simplified, so the required chip area is reduced.

BRIEF DESCRIPTION OF THE DRAWINGS

In order to describe and explain the embodiments of the present application in a better manner, reference can be made to one or several of the following accompanying drawings, but additional details or examples for describing these drawings shall not be regarded as restricting the scope of anyone of the inventive creations, the currently described embodiments and preferred embodiments of the present application.

DETAILED DESCRIPTION

In order to make more lucid and understandable the aforementioned objectives, characteristics and advantages of the present application, detailed explanations will be made below to the specific embodiments of the present application in conjunction with the accompanying drawings. The explanations below enunciate many specific details to facilitate fuller comprehension of the present application. However, the present application can be implemented by many modes other than those described in this context, and technicians skilled in the art may make similar improvements without departing from the spirit of the present application, so the present application is not restricted by the specific embodiments made public below.

Moreover, such technical wordings as "first", "second" are merely used for the purpose of description, and shall not be construed as indicating or implying relative importance, or hinting at the number of the indicated technical features. Therefore, features prescribed with "first", "second" can explicate or implicate the inclusion of one or more of such features. In the wordings used in this context, "plural", "a plurality of" mean two or more, unless otherwise expressly and specifically indicated.

In the present application, unless otherwise expressly prescribed and defined, such technical wordings as "being mounted/installed", "being connected with/to", "to connect" and "being fixed" etc. shall be understood in their broad sense—for instance, connection may be fixed, and may also be detachable, or integrated, or mechanical, or electrical, or communicable, or direct, or by means of intermediate medium, or internally communicative as of two elements, or mutually interactive as of two elements. To artisans ordinarily skilled in the art, such wordings can be understood as to their specific meanings in the present application according to specific circumstances.

Figure 1:
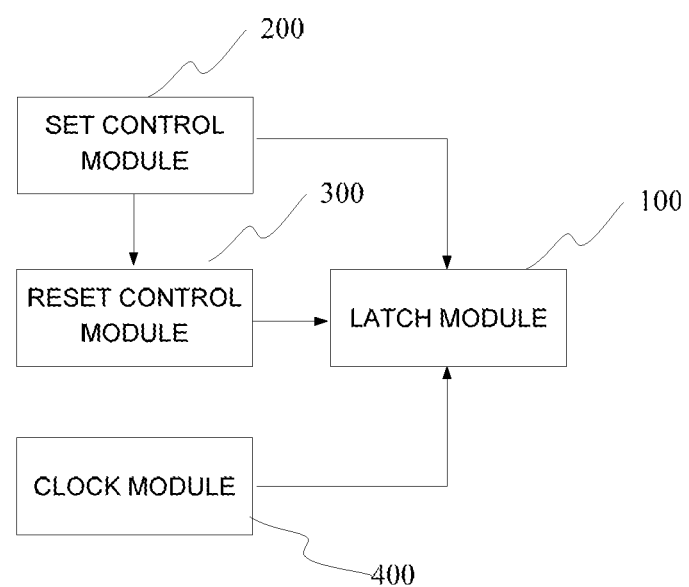
FIG. 1 is a diagram schematically describing the electrical structure of a latch circuit provided according to embodiments of the present application.
Figure 2:
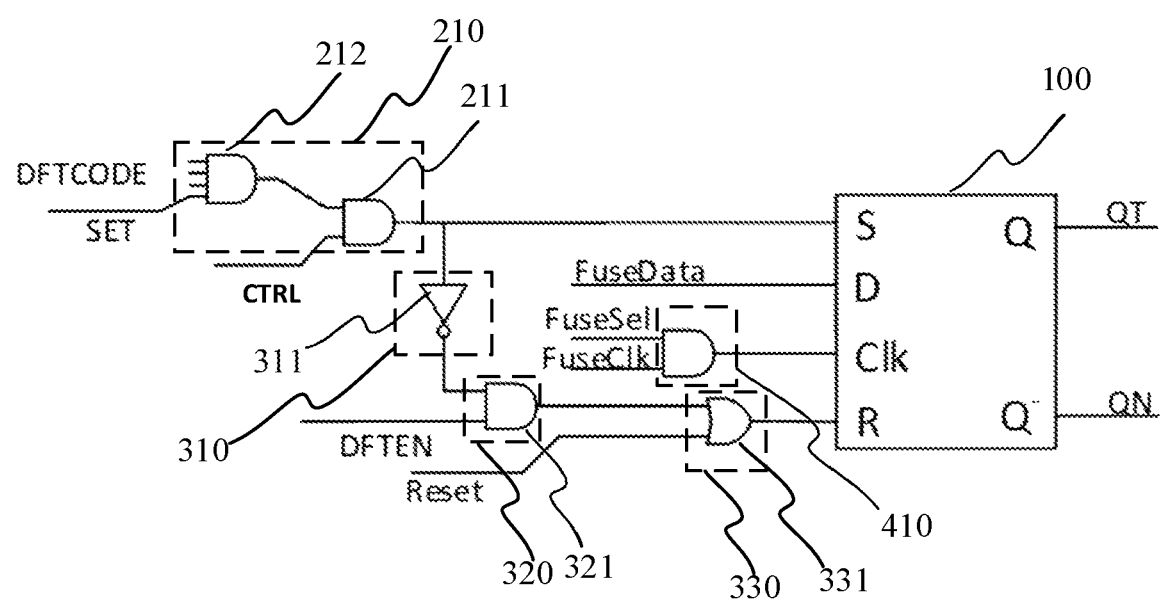
FIG. 2 is a diagram schematically describing the electrical structure of another latch circuit provided according to embodiments of the present application.

Referring to FIGS. 1 and 2, there is provided a latch circuit according to an embodiment of the present application, and the latch circuit comprises a latch module 100, a set control module 200, a reset control module 300 and a clock module 400.

The latch module 100 is employed for latching data input by a data module.

The set control module 200 is employed for controlling the latch module 100 to output a high-level signal, and a input signals of the set control module 200 include a control signal CTRL and a set signal SET.

The reset control module 300 is employed for controlling the latch module 100 to output a low-level signal, and a input signals of the reset control module 300 include an output signal of the set control module, a self-test enable signal DFTEN and a reset signal Reset; wherein the self-test enable signal DFTEN decides whether a latch is in a self test mode or a normal operation mode.

The clock module 400 is employed for providing a readout clock signal to the latch module 100.

In this embodiment, the latch circuit invokes the self test mode or the normal operation mode through the self-test enable signal DFTEN. When the self-test enable signal DFTEN=1, the latch circuit enters the self test mode, the control signal CTRL=1, the set signal SET=1, the clock module 400 is grounded, an output of the set control module 200 is a high-level signal, the latch module 100 is controlled via the output of the set control module to output the high-level signal, and feasibility test function is realized by means of the high-level signal. When the self-test enable signal DFTEN=0, the latch circuit enters the normal operation mode, the input terminal of the set signal SET is grounded, and the latch module 100 bases on the readout clock signal to receive and latch the data input by the data module. Seen as such, by settings of the latch module 100, the set control module 200, the reset control module 300 and the clock module 400 in this embodiment, the DFT latch and the fuse latch are incorporated as a trigger, whereby it is not only possible to realize the latching function of the input data, but also possible to realize the DFT function, to reduce the number of latches used, to simplify the structure of the latch circuit, and to hence reduce the required chip area.

Figure 3:
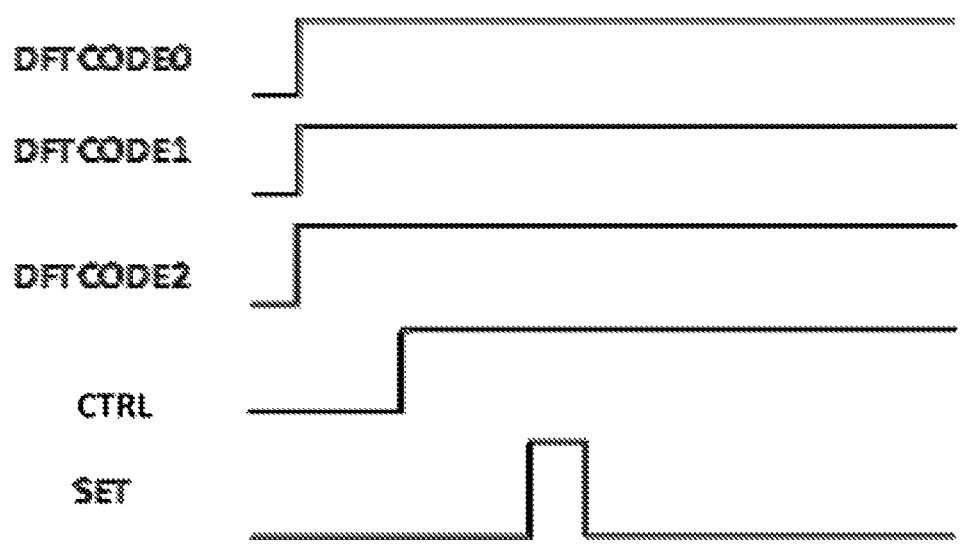
FIG. 3 is a diagram illustrating the time sequence of a plurality of a input signals of the set control module provided according to embodiments of the present application.

In one of the embodiments, a input signals of the set control module 200 further include a self-test code signal DFTCODE, and an output of the set control module 200 is connected with the set end of the latch module 100. Understandably, high-speed mixed signal test equipment is required for testing the latch, whereas self test is realized in this embodiment through input of the self-test code signal DFTCODE, thus reducing the need for automatic equipment. At the same time, synchronous test of plural latches can be realized, thus reducing the time required for the test and enhancing test efficiency. Referring to FIG. 3, in this embodiment, when the latch circuit is selected for test, three self-test code signals are chosen, namely including self-test code signal DFTCODE0, self-test code signal DFTCODE1 and self-test code signal DFTCODE2. The set control module 200 bases on the received self-test code signal DFTCODE, control signal CTRL and set signal to control the latch module 100 to output the high-level signal; specifically, when the self-test code signal DFTCODE, the control signal CTRL and the set signal are all high level, the latch module 100 outputs the high-level signal, whereby is realized feasibility test.

In one of the embodiments, the data end of the latch module 100 receives a fuse data signal FuseData. As can be understood, in DRAM, one of the main functions of the latch module 100 is to latch the fuse signal, so the data end of the latch module 100 receives the fuse data signal FuseData, whereby is realized storing and erasing of data.

In one of the embodiments, the set control module 200 includes a first logic AND unit 210 for performing logic AND on the control signal CTRL, the set signal SET and the self-test code signal DFTCODE, and thereafter outputting the resultant signals to the latch module 100 and the reset control module 300.

In this embodiment, the first logic AND unit 210 are provided with a control signal terminal, a set signal terminal and a plurality of self-test code signal terminals, in which the number of the self-test code signal terminals can be set, as three, for example, according to actual test requirements.

Under the test mode, when the self-test code signal DFTCODE0, the self-test code signal DFTCODE1, the self-test code signal DFTCODE2, the set signal SET and the control signal CTRL are all high level, the latch module 100 outputs high level.

Specifically, in this embodiment, the first logic AND unit 210 includes a first logic AND gate 211 and a fourth logic AND gate 212, of which the first logic AND gate 211 is two input AND gates, and the fourth logic AND gate 212 is four input AND gates. The four input ends of the four input logic AND gates are respectively connected with the self-test code signal DFTCODE0, the self-test code signal DFTCODE1, the self-test code signal DFTCODE2 and the set signal SET, and perform logic AND on the self-test code signal DFTCODE0, the self-test code signal DFTCODE1, the self-test code signal DFTCODE2 and the set signal SET. One input end of the two input logic AND gates is connected with the output end of the four input logic AND gates, and another input end thereof is connected with the control signal CTRL, for performing logic AND on the output data of the four input logic AND gates and the control signal CTRL and thereafter outputting the result to the set end of the latch signal, and performing test via set 0 or 1. Under the normal operation mode, after the terminal of the set signal is grounded, the set signal SET=0, and logic AND process is carried out via the four input logic AND gates and the two input logic AND gates, the output of the set control module 200 is low level.

In one of the embodiments, an output of the reset control module 300 is connected with the reset end of the latch module 100. In this embodiment, under the test mode, the terminal of the self-test enable signal DFTEN is connected with a high-level voltage signal VDD, the self-test enable signal DFTEN=1. Within the time period where the set signal SET=1, the set control module 200 controls the latch module 100 to output high level, and the output signal of the reset control module 300 is low level; when SET=0 changes to low level, the latch has to be reset, and the reset control module 300 controls the latch signal to reset through the output signal of the set control module and the self-test enable signal DFTEN, whereby the latch module 100 outputs a low-level signal, to thereby realize the test function via set 0 or 1. Under the normal operation mode, the terminal of the set signal and the terminal of the self-test enable signal DFTEN are grounded, the latch module 100 bases on the readout clock signal to receive and latch the data input by the data module, and the latch module 100 is reset via the reset signal Reset after the data is written.

In one of the embodiments, the reset control module 300 includes a reverse operation unit 310, a second logic AND unit 320 and a logic OR unit 330.

The reverse operation unit 310 is employed for reversely processing the output signal of the set control module. In this embodiment, the reverse operation unit 310 includes a second inverter 311 whose input end is connected with the output end of the two input logic AND gates in the set control module 200 for reversely processing the output signal of the set control module.

The second logic AND unit 320 is employed for performing logic AND process on the reversely processed output signal of the set control module and the self-test enable signal. In this embodiment, the second logic AND unit 320 includes a second logic AND gate 321, which is connected with the output end of the second inverter 311 and the terminal of the self-test enable signal DFTEN, for performing logic AND process on the reversely processed output signal of the set control module and the self-test enable signal, and providing the result to the logic OR gate.

The logic OR unit 330 is employed for performing logic OR on the output of the second logic AND unit 320 and the reset information and thereafter outputting the result to the latch module 100. In this embodiment, the logic OR unit 330 includes a logic OR gate 331, which is connected with the output end of the second logic AND gate 321 and the terminal of the reset signal, for performing logic OR process on the output signal of the second logic AND gate 321 and the reset signal Reset, providing the result to the reset end of the latch module 100, and controlling the latch module 100 to output a low-level signal.

Specifically, under the test mode, when the self-test code signal DFTCODE0, the self-test code signal DFTCODE1, the self-test code signal DFTCODE2, the set signal SET and the control signal CTRL are all high level, and when the output signal of the set control module is high level, the output signal of the set control module as processed by the second inverter is low level, and, at this time, the signal output after logic AND further performed by the second logic AND gate and the self-test signal is low level; when the set signal SET changes to low level, and when the output signal of the set control module is high level, the output signal of the set control module as processed by the second inverter is high level, the latch module 100 can be reset merely via the output signal of the second logic AND gate, and the latch module is controlled to output a low-level signal. Under the normal operation mode, the terminal of the set signal and the terminal of the self-test enable signal DFTEN are grounded, the output signal of the second logic AND gate 321 is low level, and the reset signal Reset is required to control the latch module 100 to reset. Specifically, when the reset signal Reset is high level, the latch module 100 is reset.

In one of the embodiments, a input signals of the clock module 400 include a fuse select signal FuseSel and a fuse clock signal FuseClk, and an output of the clock module 400 is connected with a clock end of the latch module 100. In this embodiment, the readout clock signal is generated and output by performing logic AND process on the fuse select signal FuseSel and the fuse clock signal FuseClk, so as to enable the latch module 100 to latch the fuse data signal FuseData.

In one of the embodiments, the clock module 400 includes a third logic AND unit 410 for performing logic AND on the fuse select signal FuseSel and the fuse clock signal FuseClk, and thereafter outputting the resultant signals to the latch module 100. Specifically, the third logic AND unit 410 performs logic AND on the fuse select signal FuseSel and the fuse clock signal FuseClk and thereafter outputs the resultant signals to the clock end of the latch module 100.

In one of the embodiments, the latch module 100 is a D-trigger. As can be understood, under the test mode, the terminal of the self-test enable signal DFTEN is connected with a high-level voltage signal VDD, the self-test enable signal DFTEN=1. Within the time period where the set signal SET=1, the set control module 200 controls the latch module 100 to output high level, and the output signal of the reset control module 300 is low level; when SET=0 changes to low level, the reset control module 300 controls the latch signal to reset through the output signal of the set control module and the self-test enable signal DFTEN, whereby the latch module 100 outputs a low-level signal, to thereby realize the test function via set 0 or 1. Moreover, under the normal operation mode, the terminal of the set signal and the terminal of the self-test enable signal DFTEN are grounded, the latch module 100 bases on the readout clock signal to receive and latch the data input by the data module, and the latch module 100 is reset via the reset signal Reset after the data is written, so the latch module 100 can be a D-trigger.

Figure 4:
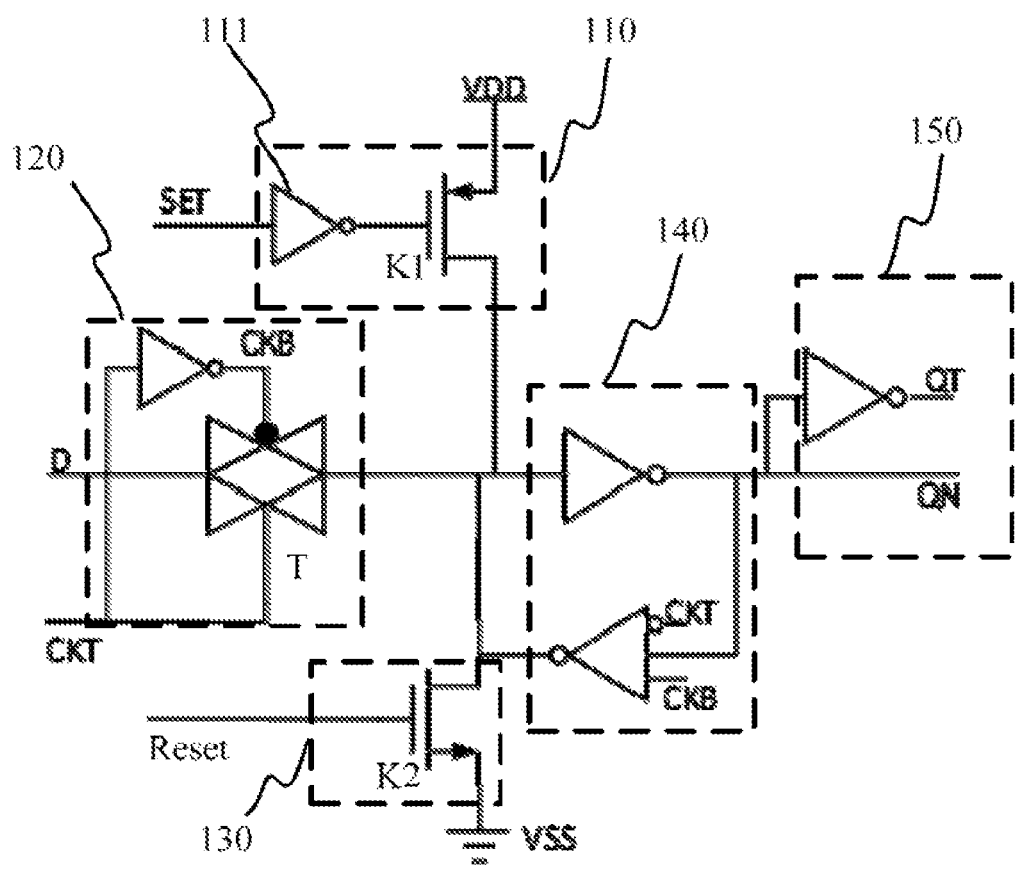
FIG. 4 is a diagram schematically describing the electrical structure of a latch module provided according to embodiments of the present application.

Referring to FIG. 4, in one of the embodiments, the D-trigger includes a set unit 110, a fuse unit 120, a reset unit 130, a latch 140 and an output unit 150.

The set unit 110 is employed for receiving and outputting the high-level signal provided by a first power supply when an output of the set control module 200 is high level under the self test mode. In this embodiment, the set unit 110 includes a first inverter 111 and a first switch tube K1. The first inverter 111 is connected to the output end of the first logic AND gate 211 in the set control module 200 to reversely process the output signal of the first logic AND gate 211, whose output end is precisely the output end of the set control module 200. The first switch tube K1 is a P-type MOS tube, whose gate electrode is connected with the output end of the first logic AND gate 211, and is employed to receive a high-level signal provided by the first power supply when the reversely processed output signal of the set control module is low level.

The fuse unit 120 is employed for receiving and outputting the fuse data signal FuseData in accordance with the readout clock signal under the normal operation mode. In this embodiment, the fuse unit 120 includes a transmission gate T; the control end of the transmission gate is equivalent to the clock end of the latch module 100 and connected with the output end of the clock module 400, and the input end of the transmission gate is equivalent to the data end of the latch module 100 and receives data input by the data module, for example, the fuse data signal FuseData. When the readout clock signal is high level, the transmission gate T is conducted, and receives the fuse data signal FuseData.

The reset unit 130 is employed for receiving and outputting the low-level signal provided by a second power supply when an output of the reset control signal CTRL is high level. In this embodiment, the reset unit 130 includes a second switch tube K2, which is an N-type MOS tube. The control end of the second switch tube K2 is equivalent to the reset end of the latch module 100 and connected with the output end of the logic OR gate 331 in the reset control module 300; when the reset signal Reset is high level or the output signal of the second logic AND gate 321 is high level, the second switch tube K2 is conducted to ground the output end of the fuse unit 120 and the output end of the set unit 110, or to provide a low-level signal to the output end of the fuse unit 120 and the output end of the set unit 110. The first power supply and the second power supply can be working power supplies of the latch module 100, and may also be separately disposed power supplies.

The latch 140 is employed for receiving and latching the high-level signal output by the set unit 110, the fuse data signal FuseData output by the fuse unit 120, and the low-level signal output by the reset unit 130. In this embodiment, the latch 140 receives and latches the high-level signal provided by the set unit 110 under the test mode, and receives and latches the fuse data signal FuseData provided by the fuse unit 120 under the normal operation mode.

The output unit 150 is employed for outputting the latched high-level signal, fuse data signal FuseData or low-level signal.

To more lucidly describe the present application, detailed descriptions are made below with reference to the working processes of the latch circuit as illustrated in FIGS. 2 and 4.

Under the test mode, the terminal of the fuse select signal is grounded, and the self-test enable signal DFTEN is connected to the high level. When the self-test code signal DFTCODE0, the self-test code signal DFTCODE1, the self-test code signal DFTCODE2, the set signal SET and the control signal CTRL are all high level, the output signal of the set control module obtained after the logic AND process is high level, the output signal of the set control module is thereafter processed by the first inverter and provided to the first switch tube K1, and the first switch tube K1 is conducted to receive the high-level signal provided by the first power supply. When the set signal SET is low level, the reset control module 300 is employed to control the latch module 100 to reset, so as to enable the latch module 100 to output a low-level signal, thereby realizing test function via set 0 or 1.

Under the normal operation mode, the terminal of the self-test enable signal DFTEN and the terminal of the set signal are grounded. When the fuse select signal FuseSel and the fuse clock signal FuseClk are all high level, the transmission gate T is conducted, and the latch 140 latches the fuse data signal FuseData transmitted via the transmission gate. Moreover, the latch module 100 is reset via the reset signal Reset after the fuse data signal FuseData is written.

To sum it up, a latch circuit is provided according to the embodiments of the present application. The latch circuit comprises a latch module 100, a set control module 200, a reset control module 300 and a clock module 400. Of these, the latch module 100 is employed for latching data input by a data module; the set control module 200 is employed for controlling the latch module 100 to output a high-level signal, and a input signals of the set control module 200 include a control signal CTRL and a set signal SET; the reset control module 300 is employed for controlling the latch module 100 to output a low-level signal, and a input signals of the reset control module 300 include an output signal of the set control module, a self-test enable signal DFTEN and a reset signal Reset; the clock module 400 is employed for providing a readout clock signal to the latch module 100. The self-test enable signal DFTEN decides whether the latch 140 is in a self test mode or a normal operation mode. In the present application, by settings of the latch module 100, the set control module 200, the reset control module 300 and the clock module 400, by enabling the set control module 200 to control the latch module 100 to output the high-level signal in the self test mode, by enabling the latch 140 to output the high-level signal for testing, and by enabling the latch module 100 to read and latch data from the data module according to the readout clock signal in the normal operation mode, realized are the function to latch the data input by the data module, and the DFT function, and the structure of the latch 140 circuit is simplified, so the required chip area is reduced.

The various technical features of the aforementioned embodiments can be randomly combined; for the sake of brevity, all possible combinations of the various technical features of the aforementioned embodiments are not exhausted; however, insofar as the combinations of the technical features are not contradictory to one another, they shall all be regarded as within the scope described in this Description.

The aforementioned embodiments merely indicate several modes to implement the present application, and their descriptions are relatively specific and detailed, but they should not be therefore understood as restriction to the inventive patent scope. As should be pointed out, persons ordinarily skilled in the art may make various modifications and improvements without departing from the conception of the present application, and all such modifications and improvements shall fall within the protection scope of the present application. Accordingly, the protection scope of the present application shall be as claimed in the attached Claims.

What is claimed is:

1. A latch circuit, characterized in comprising:
   a latch module, for latching data input by a data module;
   a set control module, for controlling the latch module to output a high-level signal, input signals of the set control module including a control signal and a set signal;
   a reset control module, for controlling the latch module to output a low-level signal, input signals of the reset control module including an output signal of the set control module, a self-test enable signal and a reset signal; and
   a clock module, for providing a readout clock signal to the latch module;
   wherein the self-test enable signal decides whether the latch circuit is in a self test mode or a normal operation mode.

2. The latch circuit according to claim 1, wherein the input signals of the set control module further include a self-test code signal, and an output of the set control module is connected with a set end of the latch module.

3. The latch circuit according to claim 2, wherein the set control module includes a first logic AND unit, for performing logic AND on the control signal, the set signal and the self-test code signal, and thereafter outputting a resultant signals to the latch module and the reset control module.

4. The latch circuit according to claim 1, wherein an output of the reset control module is connected with a reset end of the latch module.

5. The latch circuit according to claim 1, wherein the reset control module includes:
   a reverse operation unit, for reversing the output signal of the set control module;
   a second logic AND unit, for performing logic AND on an output signal of the reverse operation unit and the self-test enable signal; and
   a logic OR unit, for performing logic OR on an output of the second logic AND unit and the reset signal and thereafter outputting a result to the latch module.

6. The latch circuit according to claim 1, wherein input signals of the clock module include a fuse select signal and a fuse clock signal, and an output of the clock module is connected with a clock end of the latch module.

7. The latch circuit according to claim 6, wherein the clock module includes a third logic AND unit for performing logic AND on the fuse select signal and the fuse clock signal, and thereafter outputting a resultant signal to the latch module.

8. The latch circuit according to claim 1, wherein a data end of the latch module is connected with a fuse data signal.

9. The latch circuit according to claim 1, wherein the latch module is a D-trigger.

10. The latch circuit according to claim 9, wherein the D-trigger includes:
    a set unit, for receiving and outputting an high-level signal provided by a first power supply when an output of the set control module is high level under the self test mode;
    a fuse unit, for receiving and outputting a fuse data signal in accordance with the readout clock signal under the normal operation mode;

a reset unit, for receiving and outputting a low-level signal provided by a second power supply when an output of the reset control module is high level;

a latch, for receiving and latching the high-level signal output by the set unit, the fuse data signal output by the fuse unit, and the low-level signal output by the reset unit; and an output unit, for outputting the latched high-level signal, fuse data signal or low-level signal.

* * * * *